US011818870B2

(12) United States Patent
Gao

(10) Patent No.: US 11,818,870 B2
(45) Date of Patent: Nov. 14, 2023

(54) DATA CENTER DESIGN FOR HIGH DENSITY SERVER CLUSTERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 238 days.

(21) Appl. No.: 17/484,354

(22) Filed: Sep. 24, 2021

(65) Prior Publication Data

US 2023/0100968 A1 Mar. 30, 2023

(51) Int. Cl.
*H05K 7/20* (2006.01)

(52) U.S. Cl.
CPC ..... *H05K 7/20818* (2013.01); *H05K 7/20318* (2013.01); *H05K 7/20718* (2013.01); *H05K 7/20827* (2013.01)

(58) Field of Classification Search
CPC ........... H05K 7/20818; H05K 7/20827; H05K 7/20836; H05K 7/208
See application file for complete search history.

(56) References Cited

U.S. PATENT DOCUMENTS 7,418,825 B1 * 9/2008 Bean, Jr. ............... F25B 25/005
361/699

* cited by examiner

*Primary Examiner* — Lionel Nouketcha
(74) *Attorney, Agent, or Firm* — WOMBLE BOND DICKINSON (US) LLP

(57) ABSTRACT

The cooling system for a data center includes an information technology (IT) container, secondary condensing system, and a coolant distribution unit. In particular, an IT container includes a liquid region to store cooling liquid, a vapor region to receive vapor evaporated from the cooling liquid, and a primary condenser disposed within the vapor region to condense the vapor. For example, the external cooling air or cooling liquid is controlled to be delivered to condensers. Further, a secondary condenser is coupled to the IT container via a vapor line to receive at least a portion of the vapor from the vapor region of the IT container and to condense the portion of the vapor. Furthermore, a coolant distribution unit is coupled to the IT container and the secondary condenser to store and to distribute the cooling liquid to the IT container.

20 Claims, 7 Drawing Sheets

DATA CENTER DESIGN FOR HIGH DENSITY SERVER CLUSTERS

FIELD OF THE INVENTION

Embodiments of the present invention relate generally to the data center, cooling system, two phase immersion cooling, system architecture. More particularly, embodiments of the invention relate to a data center design for high density server clusters.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

The previous solutions for two-phase immersion cooling systems directly operate with the variation generation and condensation in the IT container. This design causes loss of coolant, and the system to be unreliable and unsafe. In addition, previous solutions may not be appropriate in hyper-scale deployment and development.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1B:
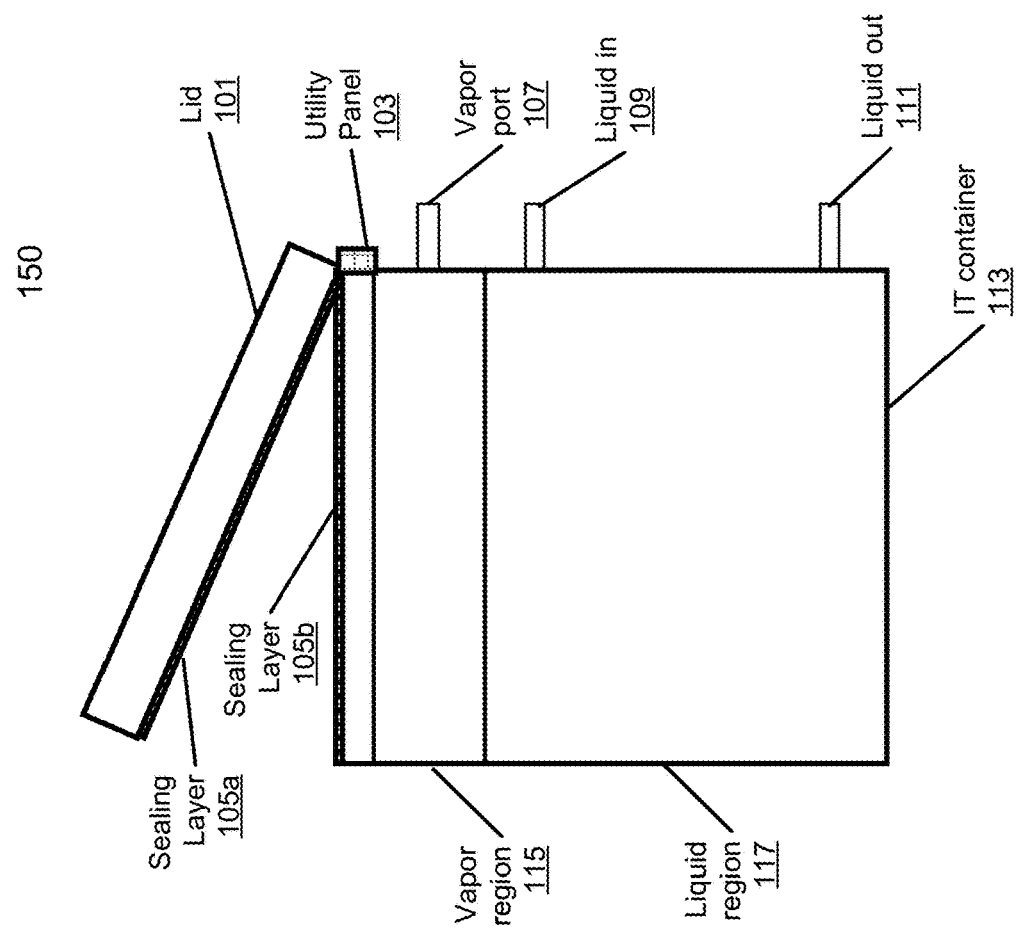
FIGS. 1A-1B show a design of the IT container according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures.

The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architectures.

The present disclosure aims to provide a solution for designing and developing thermal solutions for two-phase immersion IT containers. The design aims to develop a robust system and solution for operating and controlling hyper-scale two-phase immersion cooling, to solve the challenge of the variation in the phase change caused by the dynamic variation of vapor amount. In addition, the following items serve as additional challenges that the present disclosure aims to solve: efficient system architecture; adaptations to dynamic variations in normal and abnormal scenarios; hyper-scale heterogeneous system implementation; efficient facility side design; co-design of the facility and IT container; simplified control for of the two phase recirculation cycles; ease of solution upgrade and dynamic configuration changes based on use cases; high reliability; and Scalable solution for different use cases.

The present application relates to a design which includes how to process the first portion of vapor condensation in the IT container and a second portion of vapor within a dedicated system. In an embodiment, the dedicated system includes a condensing unit and a fluid arrangement unit. For example, the fluid arrangement unit is an air flow management system with air control panel, according to an embodiment. In an embodiment, the fluid arrangement unit is a liquid flow management unit with valves. For example, the IT container connects with the system through a vapor port. In an embodiment, each of the condensing units in the system includes a pressure sensor for measuring the vapor pressure, which is used for controlling air panels, valves, and fluid moving units. Furthermore, the external cooling source is managed and recirculated to the condensing unit, and then the second vapor is condensed back to the liquid and delivered to a two-phase coolant unit according to an embodiment.

In an embodiment, the cooling system for a data center includes an information technology (IT) container, a secondary condensing system, and a coolant distribution unit. For example, an information technology (IT) container includes a liquid region to store cooling liquid, a vapor region to receive vapor evaporated from the cooling liquid, and a primary condenser disposed within the vapor region to condense the vapor. Further, the liquid region is to store a plurality of electronic devices, which when operate, generate heat that causes the cooling liquid to evaporate according to an embodiment of the application.

In some embodiments, a secondary condensing system includes a vapor container and a secondary condenser. For example, a vapor container is coupled to the IT container via a vapor line to receive and contain least a portion of the vapor from the vapor region of the IT container. Further, a secondary condenser is disposed within the vapor container to condense the portion of the vapor using air cooling or liquid cooling received from an external cooling source according some embodiments of the application. Furthermore, for example, an amount of air cooling or liquid cooling is controlled based on an amount of vapor contained within the vapor container, such as a vapor pressure within the vapor container.

In an embodiment, a coolant distribution unit is coupled to the IT container and the secondary condenser to store and to distribute the cooling liquid to the IT container. For example, the coolant distribution unit is configured to receive cooling liquid condensed by the secondary condenser via a liquid line. Further, the IT container is one of a plurality of IT containers in a cluster according to an embodiment of the application. The secondary condenser is coupled to each of the IT containers via a respective vapor line to receive at least a portion of vapor from a corresponding IT container. In addition, the primary condenser is configured to condense the vapor to cooling liquid that is returned back to the liquid region of the IT container according to an embodiment of the application.

In an embodiment, the IT container includes a vapor port and a liquid inlet. The vapor port is to be coupled between vapor region and the vapor line to allow at least some of the vapor to escape to the vapor container of the secondary condensing system. The liquid inlet is to be coupled between the liquid region and the coolant distribution unit to receive the cooling liquid from the coolant distribution unit. Further, the cooling system further comprises a cooler system coupled to the secondary condenser via a cooling line to provide liquid cooling the secondary condenser according to an embodiment of the application. In addition, the secondary condenser comprises an air-to-liquid heat exchanger according to an embodiment of the application.

In an embodiment, the vapor container includes a pressure sensor to measure a vapor pressure of the vapor within the vapor container, and the cooler system is activated in response to determining that the vapor pressure is above a predetermined pressure threshold. For example, the cooling line comprises a valve whose opening ratio may be controlled based on the vapor pressure to activate or deactivate a fluid connection between the secondary condenser and the cooler system. In addition, the cooler system comprises an air-to-liquid heat exchanger according to an embodiment of the application.

In an embodiment, the cooling system further comprises one or more fans to circulate cooling air within the cooler system based on the vapor pressure within the secondary condenser. For example, the cooling system further comprises a cooling air channel coupled to the secondary condenser to provide air cooling to the secondary condenser. In addition, the secondary condenser comprises an air-to-air heat exchanger according to an embodiment of the application.

In an embodiment, the vapor container includes a pressure sensor to measure a vapor pressure of the vapor within the vapor container. The cooling air channel is activated in response to determining that the vapor pressure is above a predetermined pressure threshold.

Further, the cooling system comprises an air control panel disposed between the cooling air channel and the vapor container according to an embodiment of the application. The air control panel may be controlled based on the vapor pressure to activate or deactivate an air connection between the secondary condenser and the cooling air channel to allow the secondary condenser to receive cooling air.

In an embodiment, the secondary condenser is located within the cooling air channel. For example, the cooling air channel comprises an air control panel that is configurable to draw cooling air into the cooling air channel based on the vapor pressure within the secondary condenser. Further, the cooling system comprises one or more fans to circulate cooling air within the cooling air channel based on the vapor pressure within the secondary condenser according to an embodiment of the application.

According to another aspect, a data center system includes a plurality of clusters of information technology (IT) containers, a plurality of secondary condensing system and one or more coolant distribution units. For example, each IT container further includes a liquid region to store cooling liquid, a vapor region to receive vapor evaporated from the cooling liquid, and a primary condenser disposed within the vapor region to condense the vapor, as described above. In some embodiments, the vapor container includes a first region and a second region. The first region corresponds to a first cluster of IT containers, and the first region contains a first secondary condenser and a first pressure sensor.

Further, the second region corresponds to a second cluster of IT containers, and the second region contains a second secondary condenser and a second pressure sensor. In some embodiments, each of the secondary condensers is configured to condense the vapor within a local region of the vapor container in which the secondary condenser is located, using air cooling or liquid cooling received from an external cooling source. In addition, an amount of air cooling or liquid cooling is controlled based on an amount of vapor contained within the local region (e.g., vapor pressure) according some embodiments of the application. Further, for example, a first amount of air cooling or liquid cooling provided to the first secondary condenser is determined based on a first vapor pressure within the first region measured by the first pressure sensor, and a second amount of air cooling or liquid cooling provided to the second secondary condenser is determined based on a second vapor pressure within the second region measured by the second pressure sensor.

In an embodiment, the data center system further includes a cooler system coupled to the first and second secondary condensers via a respective cooling line to provide liquid cooling to the first and second secondary condensers. For example, the data center system further includes a cooling air channel, a first air control panel, and a second air control panel. In an embodiment, a cooling air channel is coupled to the first and second secondary condensers to provide air cooling to the first and second secondary condensers. Further, for example, one or more air control panels are disposed between the cooling air channel and the first region of the vapor container. Further, in some embodiments, those one or more air control panel are controlled, for example, by a controller, based on the vapor pressure measured by the corresponding one or more pressure sensors. It should be noted that the external cooling source (e.g., cooling airflow) is shared among different IT containers or clusters according an embodiment of the application. For example, the airflow is dedicated to different condensers at different time either directly or indirectly through an air to liquid heat exchanger.

Figure 1A:
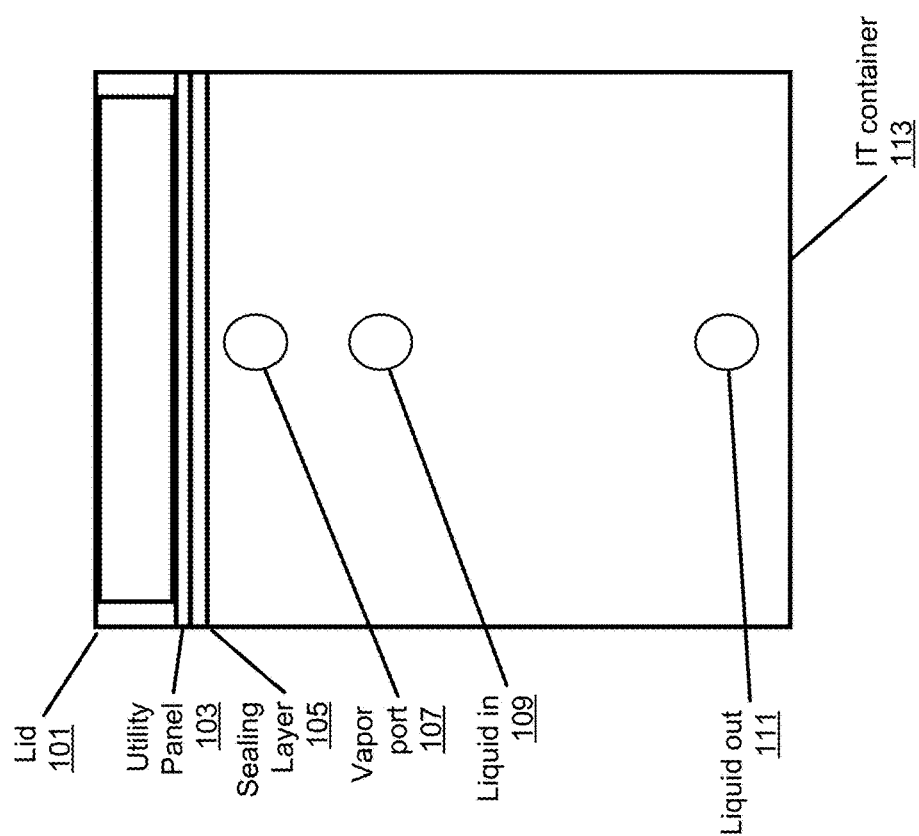

FIGS. 1A-1B show a design of the IT container according to an embodiment of the application. In particular, FIGS. 1A-1B show the IT container design 100, 150 in the system. For example, the overall system includes a co-design of IT container 113 and the cluster, as well as entire data center system.

In particular, FIG. 1A shows rear view 100 of IT container 113, and FIG. 1B shows side view 150 of IT container 113. For example, IT container 113 includes a top portion as lid 101. Further, lid 101 and main container 113 includes double sealing layers (e.g., 105a, 150b) according to an embodiment of the application. In an embodiment, those layers (105a, 105b) are used to ensure lid 101 and main container 113 are fully sealed during normal operation. For example, the vapor may not be able to escape from the defined area. In an embodiment, in order to better assist with this full vapor containment, utility panel 103 is designed on the rear side attached onto lid 101, and this design is for all the physical connectors and connections interfaces, for fluid, electricity, communication (e.g., 107, 109, 111) and so on.

Further, in an embodiment, since the vapor is fully contained, the system design (e.g., 100, 150) requires to accommodate the variations in vapor. For example, under normal operation, evaporation and condensation are in equilibrium status. However, such equilibrium may be broken due to many reasons, such as the variation in power density, cooling capacity, server operations and so on. Therefore, vapor pressure balancing and regulating within each of the container is critical for proper performance and for an operation safety.

In particular, FIG. 1B shows liquid region 117 and vapor region 115 according an embodiment of the application. For example, vapor port 107 is designed to connect with the vapor line to allow at least a portion of the vapor to reach external such as a secondary condensing system. In an embodiment, liquid inlet port 109 and liquid outlet port 111 are connected with the two-phase coolant unit. Inlet port 109 is used to fill the two-phase coolant into the IT container. Outlet port 111 is used to drain the coolant out of the IT container. Further, for example, container 113 includes a first condensing unit which is not shown in these figures.

For example, IT container 113 includes a liquid region 117 to store cooling liquid, a vapor region 115 to receive vapor evaporated from the cooling liquid, and a primary condenser (not shown) disposed within the vapor region to condense the vapor. For example, the liquid region 117 is to store a plurality of electronic devices, which when operate, generate heat that causes the cooling liquid to evaporate.

Figure 2:
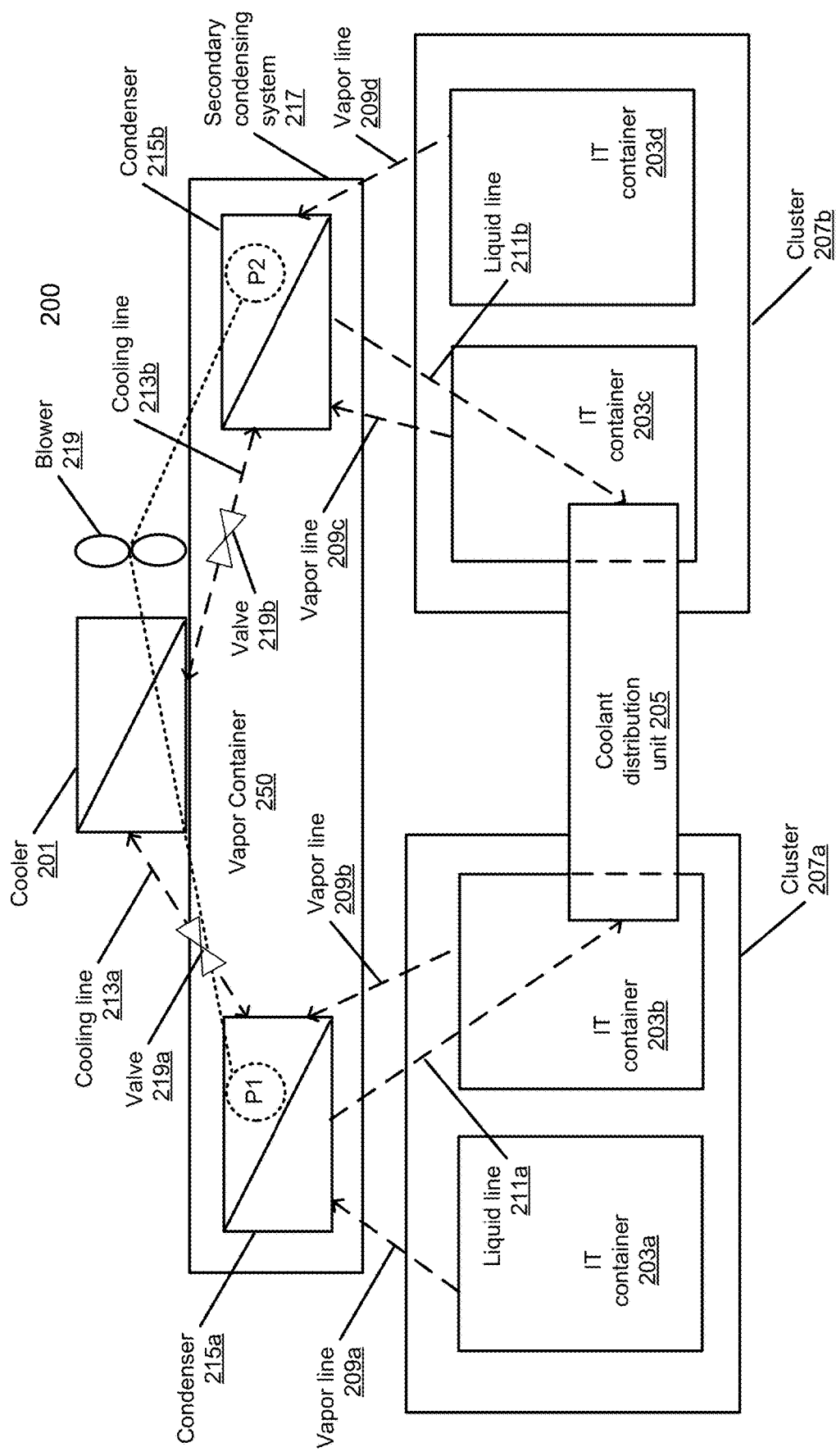
FIG. 2 shows an aisle end view of a system design according to an embodiment of the application.

FIG. 2 shows an aisle end view of a system design according to an embodiment of the application. In particular, FIG. 2 shows system design 200. It is shown that each of the IT container (e.g., 203a, 203b, 203c, 203d) as presented in FIG. 1 are connected with secondary condensing system 217 according to an embodiment of the application. In FIG. 2, for example, secondary condensing system 217 is shared by multiple IT containers (e.g., 203a, 203b, 203c, 203d), and multiple clusters (e.g., 207a, 207b). In some embodiments, secondary condensing system 217 includes a vapor container 250 and a secondary condenser (e.g., 215a, 215b). The vapor container 250 is coupled to the IT container (e.g., 203a, 203b, 203c, 203d) via a vapor line (e.g., 209a, 209b, 209c, 209d) to receive and contain least a portion of the vapor from the vapor region of the IT container (e.g., 203a, 203b, 203c, 203d).

Further, the secondary condenser (e.g., 215a, 215b) is disposed within the vapor container 250 to condense the portion of the vapor using liquid cooling received from an external cooling source (e.g., cooler 201) according some embodiments of the application. Furthermore, for example, an amount of air cooling or liquid cooling is controlled based on an amount of vapor contained within the vapor container 250 such as vapor pressure within the vapor container 250. For example, condensing system 217 which is also the dedicated system are designed as a cluster level or data center facility level unit.

In an embodiment, the individual IT container (e.g., 203a, 203b, 203c, 203d) is connected to condensing system 217 through the vapor line (e.g., 209a, 209b, 209c, 2009d) and vapor port. Condensing system 217 may include internal fluid distribution hardware to connect individual vapor line (e.g., 209a, 209b, 209c, 2009d) with the condensing unit (e.g., condenser 215a, condenser 215b). In an embodiment, those condensing units are connected with the external cooler through the cooling line (e.g., 213a, 213b).

In an embodiment, the cooling lines (e.g., 213a, 213b) are equipped with one or more valves, such as valve 219a and valve 219b. For example, the valve (e.g., 219a, 219b) controls the cooling fluid recirculating to the condensing unit (e.g., condenser 215a, condenser 215b). Although not shown, each of cooling lines 213a and 213b represents a cooling loop. The cooling loop includes a liquid supply line from cooler 201 to a secondary condenser secondary condensers 215a and 215b. The cooling loop further includes a liquid return line from the corresponding secondary condenser back to cooler 201. The valve may be disposed on a liquid supply line and controlled by a controller (not shown) to control an amount of cooling liquid to be supplied to the secondary condenser. Further, the external cooling can be different coolers (e.g., 201). In an embodiment, in most of the external cooler design, blower or fan 219 is needed as shown in FIG. 2, which may also be controlled by the controller based on the vapor pressure within vapor container 250. For example, the cooling lines (e.g., 213a and 213b) represents the full loops.

In an embodiment, the condensing units (e.g., condenser 215a, condenser 215b) within condensing system 217 are then connected to two-phase coolant distribution unit 205 through the liquid line (e.g., 211a, 211b). When the vapor is condensed back to cooling liquid, the cooling liquid is transmitted from a condenser to the coolant distribution unit 205 via the respective liquid line (e.g., liquid lines 211a-211b). Two-phase coolant distribution unit 205 can also designed as a facility level or cluster level unit. In an embodiment, two-phase coolant distribution unit 205 is connected to each of the individual IT containers (e.g., 203a, 203b, 203c, 203d) to supply two-phase coolant to the IT containers and/or to drain the coolant from the IT containers. Further, two-phase coolant distribution unit 205 connected to the individual IT container (e.g., 203a, 203b, 203c, 203d) may include an immersion tank containing immersion cooling liquid therein according to an embodiment of the application.

In an embodiment, a region of the vapor container surrounding or near each of the condensing unit such (e.g., condenser 215a, condenser 215b) as condenser 215a and 215b includes at least one pressure sensor (e.g., P1, P2) to measure the vapor pressure within the region. For example, the pressure sensors (e.g., P1, P2) are used to control the cooling delivery from cooler 201 to the corresponding condenser (e.g., 215a, 215b) which will be described further below.

In an embodiment, the cooling system for a data center includes an information technology (IT) container (e.g., 203a, 203b, 203c, 203d), one or more condensers (e.g., 215a, 215b), and a coolant distribution unit (e.g., 205). An information technology (IT) container (e.g., 203a, 203b, 203c, 203d) includes a liquid region to store cooling liquid, a vapor region to receive vapor evaporated from the cooling liquid, and a primary condenser disposed within the vapor region to condense the vapor. The liquid region is to store a plurality of electronic devices, which when operate, generate heat that causes the cooling liquid to evaporate. Further, a secondary condenser (e.g., 215a, 215b) is coupled to the IT container (e.g., 203a, 203b, 203c, 203d) via a vapor line (e.g., 209a. 209b, 209c, 209d) to receive at least a portion of the vapor from the vapor region of the IT container (e.g., 203a, 203b, 203c, 203d) and to condense the portion of the vapor according to an embodiment of the application.

In an embodiment, a coolant distribution unit (e.g., 205) is coupled to the IT container (e.g., 203a, 203b, 203c, 203d) and the secondary condenser (e.g., 215a, 215b) to store and to distribute the cooling liquid to the IT container (e.g., 203a, 203b, 203c, 203d). The coolant distribution unit (e.g., 205) is configured to receive cooling liquid condensed by the secondary condenser (e.g., 215a, 215b) via a liquid line (e.g., 211a, 211b).

According to an embodiment of the application, the IT container (e.g., 203a, 203b, 203c, 203d) is one of a plurality of IT containers (e.g., 203a, 203b, 203c, 203d) in a cluster (e.g., 207a, 207b). For example, the secondary condenser (e.g., 215a, 215b) is coupled to each of the IT containers (e.g., 203a, 203b, 203c, 203d) via a respective vapor line (e.g., 209a, 209b) to receive at least a portion of vapor from a corresponding IT container (e.g., 203a, 203b, 203c, 203d). A secondary condenser is configured to condense the vapor received from an IT container and return the cooling liquid to coolant distribution unit 205. In this example, each of secondary condensers 215a and 215b may include an air-to-liquid heat exchanger, in which the cooling liquid received from cooler 201 exchanges the heat from the vapor contained in vapor container 250. The vapor is condensed back to a liquid form as cooling liquid and the cooling liquid then is transmitted to coolant distribution unit 205. On the other hand, the primary condenser is configured to condense the vapor to cooling liquid that is returned back to the liquid region of the IT container (e.g., 203a, 203b, 203c, 203d) according to an embodiment of the application.

In an embodiment, the cooling system further comprises a cooler system (e.g., 201) coupled to the secondary condenser (e.g., 215a, 215b) via a cooling line (e.g., 213a, 213b) to provide liquid cooling to the at least a portion of the vapor received at by the secondary condenser (e.g., 215a, 215b). For example, the secondary condenser (e.g., 215a, 215b) comprises an air-to-liquid heat exchanger.

According to an embodiment of the application, a local region surrounding a secondary condenser (e.g., 215a, 215b) includes a pressure sensor (e.g., P1, P2) to measure a vapor pressure of the vapor within the region. For example, the cooler system 201 is activated in response to determining that the vapor pressure is above a predetermined pressure threshold.

In an embodiment, the cooling line (e.g., 213a, 213b) comprises a valve that is controlled based on the vapor pressure to activate or deactivate a fluid connection between the secondary condenser (e.g., 215a, 215b) and the cooler system (e.g., 201). For example, the cooler system (e.g., 201) comprises an air-to-liquid heat exchanger. In addition, the cooling system (e.g., 201) further comprises one or more fans (e.g., 219) to circulate cooling air within the cooler system (e.g., 201) based on the vapor pressure within the region according to an embodiment of the application. It should be noted, in FIG. 2, the external cooling source generated by cooler 201 and blower 219 are controlled by the condensers separately. For example, the cooling source (e.g., air) is delivered to the condenser (e.g., 215a, 215b) based on the pressure sensor (e.g., P1, P2).

Figure 3:
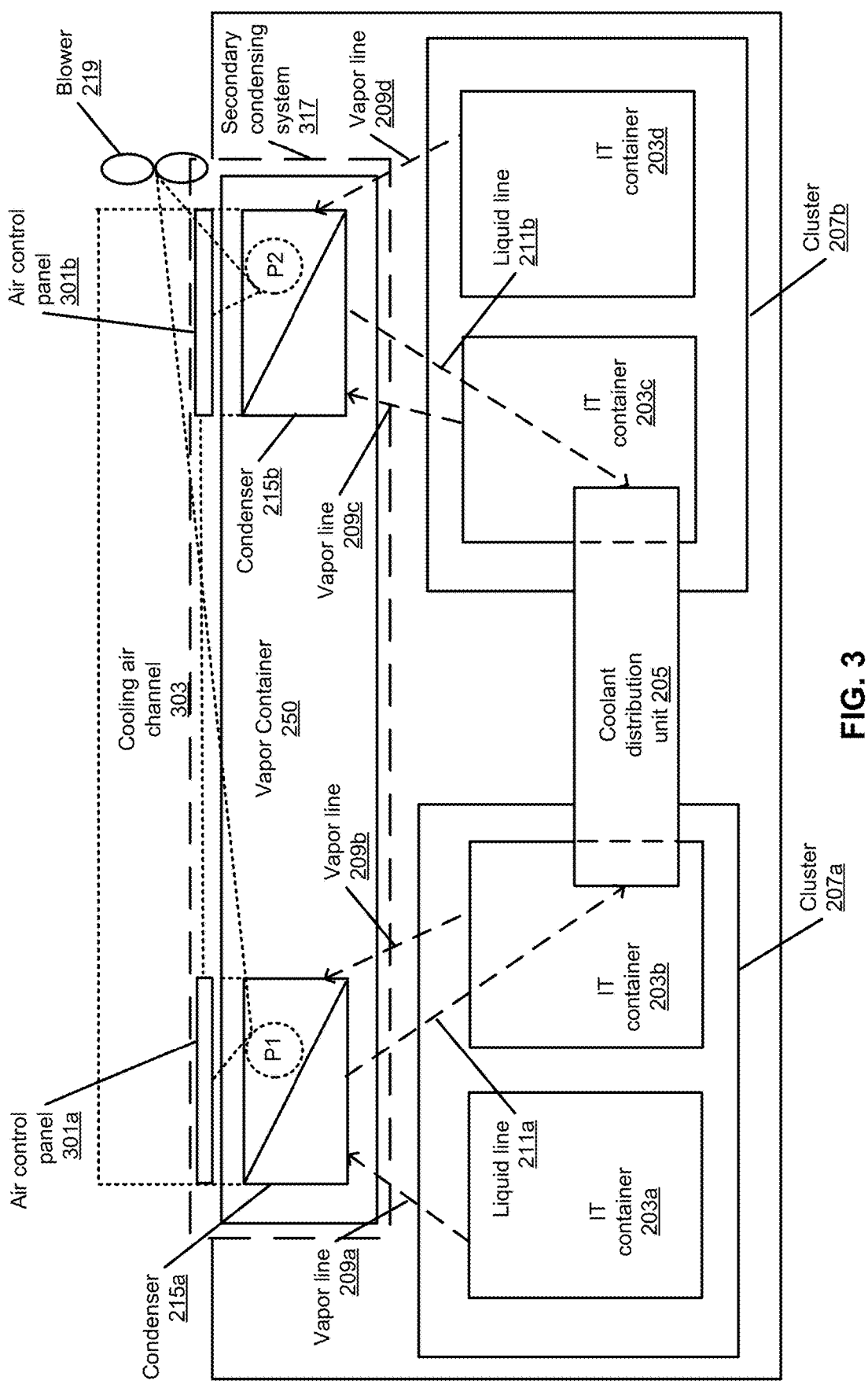
FIG. 3 shows an aisle end view of a system design with a direct air system according to certain embodiments of the application.

FIG. 3 shows an aisle end view of a system design with a direct air system according to certain embodiments of the application. In particular, FIG. 3 shows another design 300 where the data center is designed using direct air cooling for the condensing units (e.g., 215a, 215b) within the condensing system (e.g., 317).

In some embodiments, the vapor container includes a first region and a second region. For example, a first region corresponds to a first cluster (e.g., 207a) of IT containers (e.g., 203a, 203b), and the first region contains a first secondary condenser (e.g., 215a) and a first pressure sensor (e.g., P1). Further, a second region corresponds to a second cluster (e.g., 207b) of IT containers (e.g., 203c, 203d), and the second region contains a second secondary condenser (e.g., 215b) and a second pressure sensor (e.g., P2). In some embodiments, each of the secondary condensers (e.g., 215a, 215b0 is configured to condense the vapor within a local region of the vapor container in which the secondary condenser (e.g., 215a, 215b) is located, using air cooling received from an external cooling source. Each secondary condenser may include an air-to-air heat exchanger, in which the cooling air received from cooling air channel 303 exchanges the heat from the vapor contained in vapor container 250. The vapor is condensed back to a liquid form as cooling liquid and the cooling liquid then is transmitted to coolant distribution unit 205.

In addition, an amount of air cooling or liquid cooling is controlled based on an amount of vapor contained within the local region according some embodiments of the application. Further, for example, a first amount of air cooling or liquid cooling provided to the first secondary condenser (e.g., 215a) is determined based on a first vapor pressure within the first region measured by the first pressure sensor (e.g., P1), and a second amount of air cooling or liquid cooling provided to the second secondary condenser (e.g., 215b) is determined based on a second vapor pressure within the second region measured by the second pressure sensor (e.g. P2).

In an embodiment, the data center system further includes a cooling air channel (e.g., 303), a first air control panel (e.g., 301a), and a second air control panel (e.g., 301b). In an embodiment, cooling air channel 303 is coupled to the first and second secondary condensers to provide air cooling to the first and second secondary condensers (e.g., 215a, 215b). Further, for example, one or more air control panels (e.g., 301a, 301b) are disposed between the cooling air channel and the first region of the vapor container. Further, in some embodiments, opening of the air control panel (301a, 301b) are controlled based on the vapor pressure measured by the corresponding one or more pressure sensors (e.g., P1, P2).

In an embodiment, the cooling air channel (e.g., 303) is connected to the external airflow blower (e.g., 219). For example, the cooling air channel (e.g., 303) is also connected to the individual condensing units (e.g., 215a, 215b). According an embodiment of the application, the channel (e.g., 303) also includes air control panel (e.g., 301a, 301b) such as air control panel 301a and 301b. In an embodiment, these are used for regulating the airflow passing through the condensing unit (e.g., 215a, 215b). Further, for example, condensing system 317 is coupled with cooling air channel 303 for airflow management to deliver airflow to the condensers (e.g., 215a, 215b). In addition, condensing system includes one or more air control panels (e.g., 301a, 301b).

As described in previous sections, the pressure sensors (e.g., P1, P2) are used for controlling the cooling fluid according to an embodiment of the application. In this design, for example, the pressure sensor (e.g., P1, P2) also includes the function for the air control panel (e.g., 301a, 301b) to at least partially open or close. In an embodiment, when the pressure is higher than the designed threshold, the pressure enables the air control panel to be opened.

In an embodiment, a design is to only build one external cooling air channel (e.g., 303) connecting with several sub-channels. For example, those sub-channels include air control panel (e.g., 301a, 301b). In other words, this is to enable the operation that localized the cooling air flow delivery. In addition, such localized design may significantly increase the system operation efficiency.

In an embodiment, the proposed design 300 highly utilizes the concept that centralized the system design and localized the distribution. For example, the condensing system (e.g., 317) is centralized, however, it enables to collect second portion of the vapor from local container (e.g., 203a, 203b, 203c, 203d).

In an embodiment, two-phase coolant distribution unit 205 is centralized, and it enables to delivery coolant to individual container (e.g., 203a, 203b, 203c, 203d). For example, cooling air channel 303 as well as blower 219 is centralized, and it enables to delivery air to individual condensing unit (e.g., 215a, 215b).

In an embodiment, the primary condenser is configured to condense the vapor to cooling liquid that is returned back to the liquid region of the IT container (e.g., 203a, 203b, 203c, 203d). For example, the cooling system further comprises a cooling air channel (e.g., 303) coupled to the secondary condenser (e.g., 215a, 215b) to provide air cooling to the at least a portion of the vapor received at by the secondary condenser (e.g., 215a, 215b). In addition, the secondary condenser (e.g., 215a, 215b) comprises an air-to-air heat exchanger according to an embodiment of the application.

In an embodiment, a local region of the vapor container surrounding or near a secondary condenser (e.g., 215a, 215b) includes a pressure sensor (e.g., P1, P2) to measure a vapor pressure of the vapor within the local region. For example, the cooling air channel (e.g., 303) is activated in response to determining that the vapor pressure is above a predetermined pressure threshold.

In an embodiment, the cooling system further comprises an air control panel (e.g., 301a, 301b) disposed between the cooling air channel (e.g., 303) and the secondary condenser (e.g., 215a, 215b). For example, the air control panel (e.g., 301a, 301b) is controlled based on the vapor pressure to activate or deactivate (or at least partially open or close) an air connection between the secondary condenser (e.g., 215a, 215b) and the cooling air channel (e.g., 303) to allow the secondary condenser (e.g., 215a, 215b) to receive cooling air.

In an embodiment, the cooling air channel (e.g., 303) comprises an air control panel (301a, 301b) that is configurable to draw cooling air into the cooling air channel (e.g., 303) based on the vapor pressure within the secondary condenser (e., 215a, 215b). For example, the cooling system further comprises one or more fans (e.g., 219) to circulate cooling air within the cooling air channel (e.g., 303) based on the vapor pressure within the secondary condenser (e.g., 215a, 215b).

Figure 4:
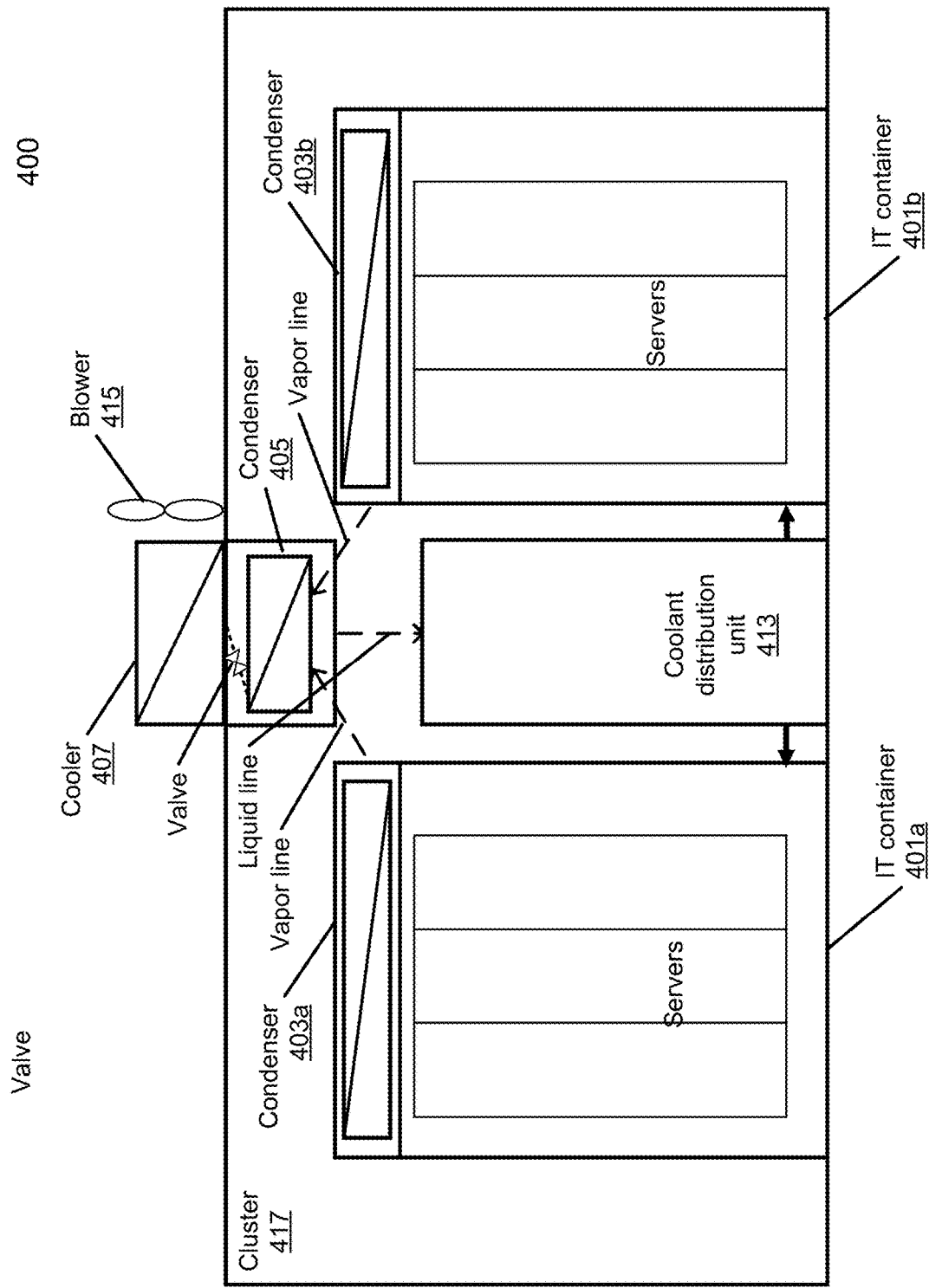
FIG. 4 shows an aisle end view of a system design with cooling water according to an embodiment of the application.

FIG. 4 shows an aisle end view of a system design with cooling water according to an embodiment of the application. In particular, FIG. 4 shows the end view of system design 400. For example, design 400 includes two rows of containers (e.g., 401a, 401b) shares one condensing system. In an embodiment, FIG. 4 maybe only show a portion of the overall system, which means the solution can be expanding easily.

In an embodiment, two-phase coolant distribution unit 413 is connected to all the IT containers (e.g., 401a, 401b) to supply or drain two-phase coolant. In addition, the condensing unit (e.g., 403a, 403b, 405) shown in this figure represents the container based local condensing unit (e.g., 403a, 403b) and the condensing unit (e.g., 405) represents the condensing unit within the condensing system.

In an embodiment, cooler 407 and blower 415 maybe shared with two or more such cluster (e.g., 417) in a data center referring FIG. 2. For example, design 400 highly utilizes the concept that centralized the system design and localized the distribution. Further, the condensing system (e.g., 405) is centralized, however, it enables to collect second portion of the vapor from local container (e.g., 401a, 401b) according to an embodiment of the application.

In an embodiment, two-phase coolant distribution unit 413 is centralized, and it enables to delivery coolant to individual container (e.g., 401a, 401b). For example, blower 415 is centralized, and it enables to delivery air to cooler 407. Further, the primary condenser (e.g., 406a, 40.3b) is configured to condense the vapor to cooling liquid that is returned back to the liquid region of the IT container (e.g., 401a, 401b) according to an embodiment of the application. In addition, the secondary condenser (e.g., 405) comprises an air-to-air heat exchanger according to an embodiment of the application.

Figure 5:
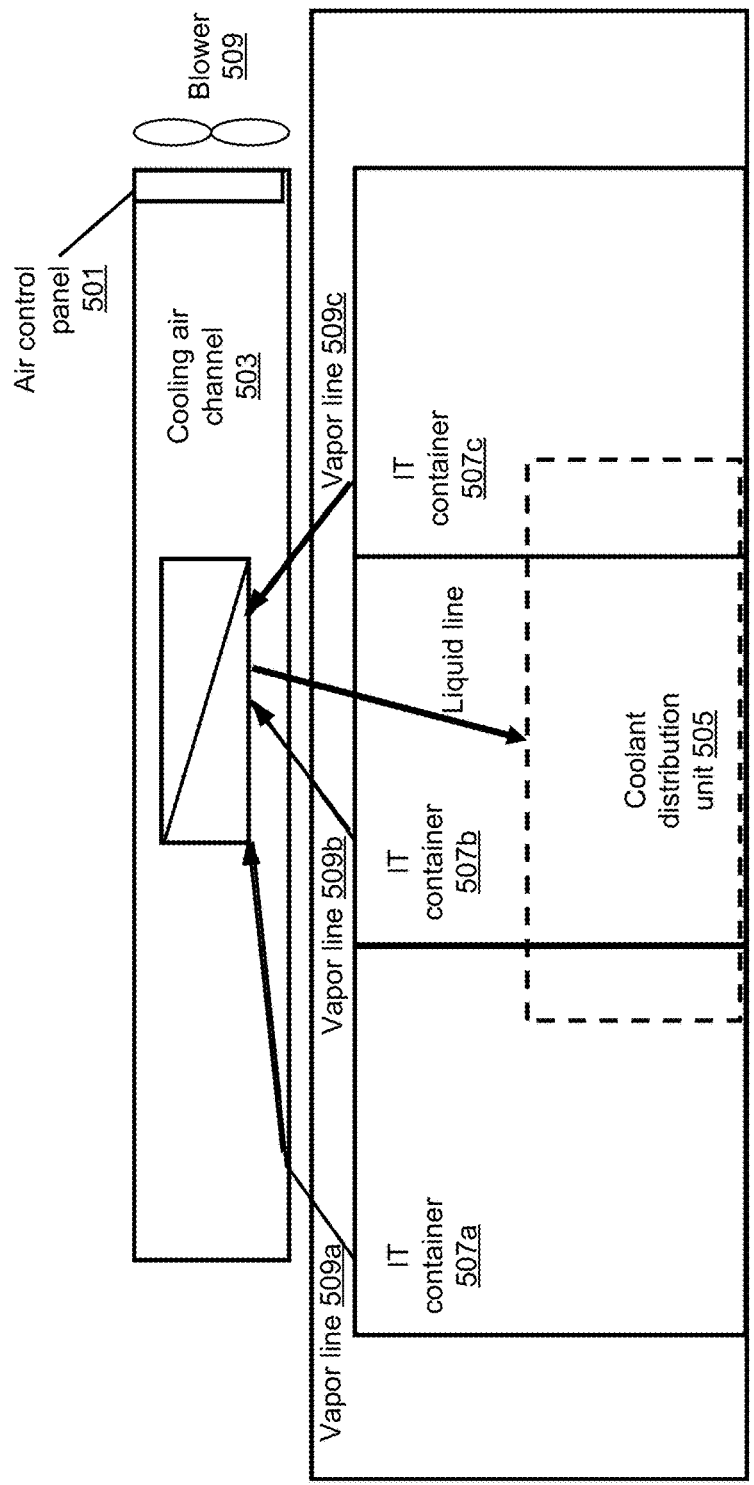
FIG. 5 shows a view from an aisle of a system design with a cooling air channel according to an embodiment of the application.

FIG. 5 shows a view from an aisle of system design 500 with a cooling air channel according to an embodiment of the application. In particular, FIG. 5 shows system design 500 of a cluster that the cooling air channel (e.g., 503) is used for one row of the container (e.g., 507a, 507b, 507c).

As described in the previous sections, the condensing system includes the vapor managing hardware system and condensing unit according to an embodiment of the application. In this design, for example, it is shown that the cooling air channel (e.g., 503) includes the air control panel (e.g., 501) for itself. In an embodiment, the blower (e.g., 509) located at the ambient maybe shared by multiple clusters.

In an embodiment, the cooling system includes IT) containers (e.g., 507a, 507b, 507c, 507d), one or more condensers, and a coolant distribution unit (e.g., 505). For example, a secondary condenser is coupled to the IT container (e.g., 507a, 507b, 507c) via a vapor line (e.g., 509a. 509b, 509c) to receive at least a portion of the vapor from the vapor region of the IT container (e.g., 507a, 507b, 507c) and to condense the portion of the vapor.

In an embodiment, a coolant distribution unit (e.g., 505) is coupled to the IT container (e.g., 507a, 507b, 507c) and the secondary condenser to store and to distribute the cooling liquid to the IT container (e.g., 507a, 507b, 507c). For example, the coolant distribution unit (e.g., 505) is configured to receive cooling liquid condensed by the secondary condenser via a liquid line.

In an embodiment, the IT container (e.g., 507a, 507b, 507c) is one of a plurality of IT containers (e.g., 507a, 507b, 507c) in a cluster. For example, the secondary condenser is coupled to each of the IT containers (e.g., 507a, 507b, 507c) via a respective vapor line (e.g., 509a. 509b, 509c) to receive at least a portion of vapor from a corresponding IT container (e.g., 507a, 507b, 507c).

Figure 6:
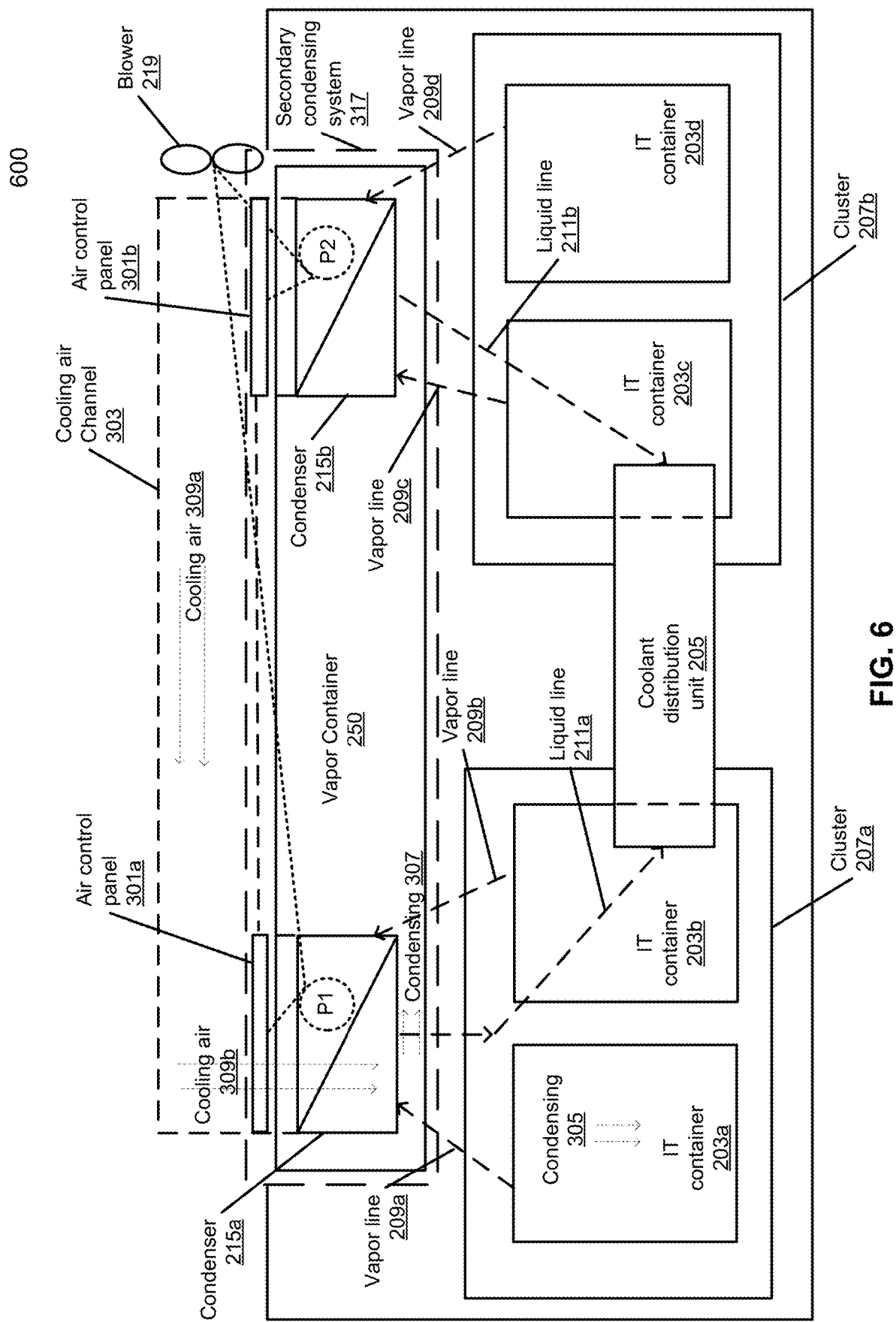
FIG. 6 shows an example of a system operation according to an embodiment of the application.

FIG. 6 shows an example of a system operation according to an embodiment of the application. In particular, FIG. 6 shows system operation 600. In an embodiment, the left IT container (e.g., 203a, 203b)) includes some of the vapor travelling to the condenser during the operation (e.g., condensing 305) while the others are under full container internal two-phase recirculation.

Further, for example, the second portion of vapor travels through the vapor line (e.g., 209a, 209b) to the condenser (e.g., 215a), which increases the pressure within it. In addition, Pressure (e.g., P1) enables the system to open the air control panel (e.g., 301a) as well as the blower (e.g., 219), and then the cooling air is only delivered to condenser 215a.

According an embodiment of the application, the vapor is condensed back to the liquid and return back to the two-phase coolant distribution unit (e.g., 205). For example, condensation 305 is the container internal two-phase coolant recirculation. Further, condensation 307 is the vapor condensation within the condensing unit (e.g., 215a) in the condensing system (e.g., 317) according to an embodiment of the application. For example, condensation 305 uses cooling water in an embodiment, and condensation 307 uses cooling airflow in this design.

In an embodiment, a primary condenser is configured to condense (e.g., 305) the vapor to cooling liquid that is returned back to the liquid region of the IT container (e.g., 203a, 203b, 203c, 203d). Further, the cooling system comprises a cooling air channel (e.g., 303) coupled to the secondary condenser (e.g., 215a, 215b) to provide air cooling to the at least a portion of the vapor received at by the secondary condenser (e.g., 215a, 215b) according to an embodiment of the application. In addition, the secondary condenser (e.g., 215a, 215b) comprises an air-to-air heat exchanger according to an embodiment of the application.

In an embodiment, a local region surrounding a secondary condenser (e.g., 215a, 215b) comprises a pressure sensor (e.g., P1, P2) to measure a vapor pressure of the vapor within the local region. For example, the cooling air channel (e.g., 303) is activated in response to determining that the vapor pressure is above a predetermined pressure threshold. Further, the cooling system comprises an air control panel (e.g., 301a, 301b) disposed between the cooling air channel (e.g., 303) and the secondary condenser (e.g., 215a, 215b) according to an embodiment of the application. For example, the air control panel (e.g., 301a, 301b) is controlled based on the vapor pressure to activate or deactivate an air connection between the secondary condenser (e.g., 215a, 215b) and the cooling air channel (e.g., 303) to allow the secondary condenser (e.g., 215a, 215b) to receive cooling air 309a, 309b.

In an embodiment, the secondary condenser (e.g., 215a, 215b) is located within the vapor container of the secondary condensing system 317. For example, the cooling air channel (e.g., 303) comprises an air control panel (301a, 301b) that is configurable to draw cooling air (e.g., 309a, 309b) into the cooling air channel (e.g., 303) based on the vapor pressure (e.g., P1, P2) within the secondary condenser (e., 215a, 215b). Further, the cooling system comprises one or more fans (e.g., 219) to circulate cooling air (e.g., 309a, 309b) within the cooling air channel (e.g., 303) based on the vapor pressure within the secondary condenser (e.g., 215a, 215b) according to an embodiment of the application. For example, when the pressure P1 is over the threshold and P2 is not, air control panel 301a will make cooling air 309b into condenser 201a, and air control panel 301b will prevent cooling air 309a into condenser 201b.

Figure 7:
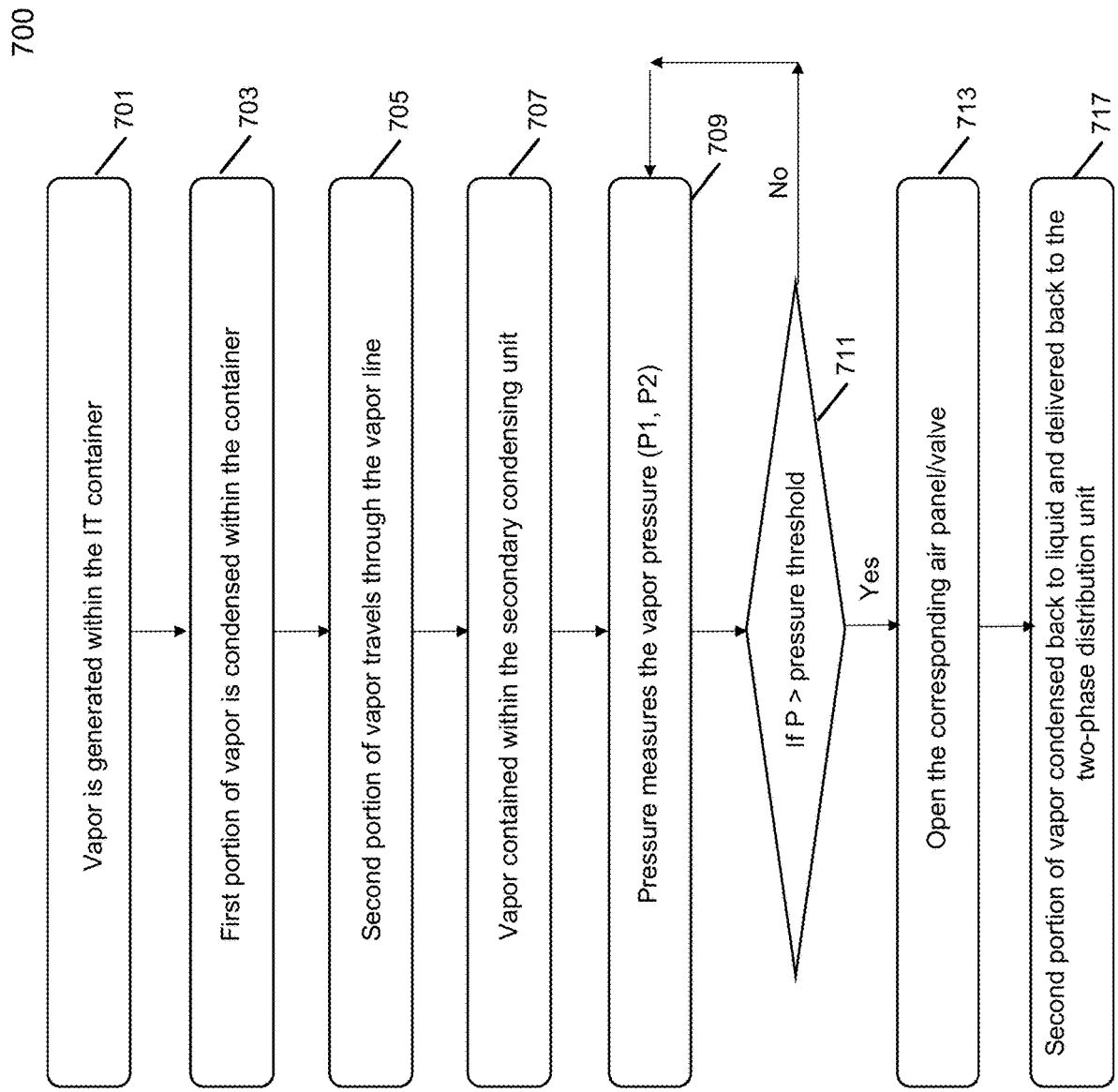
FIG. 7 shows an example of an operation flowchart according to an embodiment of the application.

FIG. 7 shows an example of operation flowchart 700 according to an embodiment of the application. FIG. 7 shows the overall system function and operation, including the two-phase fluid path among the container, condensing system, and the two phase coolant unit, as well as the control of the external cooling source with the sensors.

In an embodiment, at operation 701, the vapor is generated within the IT container (e.g., 113, 203a, 203b, 203c, 203d, 401a, 401b, 507a, 507b, 507c). Then, at operation 703, the first portion of vapor is condensed within the container (e.g., 113, 203a, 203b, 203c, 203d, 401a, 401b, 507a, 507b, 507c). Next, at operation 705, the second portion of vapor travels through the vapor line (e.g., 209a, 209b, 209c, 209d). Then, at operation 707, vapor is contained within the secondary condensing unit (e.g., 215a, 215b). Next, at operation 709, pressure measures the vapor pressure (P1, P2) according to an embodiment of the application.

In an embodiment, at operation 711, if the pressure P measured by the pressure sensor (e.g., P1, P2) is larger than a pressure threshold, then goes back at operation 709, the pressure sensor (e.g., P1, P2) will measure the vapor pressure again. For example, the secondary condenser (e.g., 215a, 215b) comprises a pressure sensor (e.g., P1, P2) to measure a vapor pressure of the vapor within the secondary condenser (e.g., 215a, 215b), and the cooler system (e.g., 201) is activated in response to determining that the vapor pressure (e.g., P1, P2) is above a predetermined pressure threshold.

In an embodiment, at operation 711, if the pressure P measured by the pressure sensor (e.g., P1, P2) is not larger than a pressure threshold, then at operation 713, the system will open the corresponding air panel/valve (e.g., 301a, 301b). For example, the cooling line (e.g., 213a, 213b) comprises a valve that is controlled based on the vapor pressure (e.g., P1, P2) to activate or deactivate a fluid connection between the secondary condenser (e.g., 215a, 215b) and the cooler system (e.g., 201). Then, at operation 717, the second portion of vapor condensed back to liquid and delivered back to the two-phase coolant distribution unit (e.g., 205) according to an embodiment of the application.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system for a data center, comprising:
   an information technology (IT) container including a liquid region to store cooling liquid, a vapor region to receive vapor evaporated from the cooling liquid, and a primary condenser disposed within the vapor region to condense the vapor;
   a secondary condensing system, comprising
      a vapor container coupled to the IT container via a vapor line to receive and contain least a portion of the vapor from the vapor region of the IT container, and
      a secondary condenser disposed within the vapor container to condense the portion of the vapor using air cooling or liquid cooling received from an external cooling source, wherein an amount of air cooling or liquid cooling is controlled based on an amount of vapor contained within the vapor container; and
   a coolant distribution unit coupled to the IT container and the secondary condenser to store and to distribute the cooling liquid to the IT container, wherein the coolant distribution unit is configured to receive cooling liquid condensed by the secondary condenser via a liquid line.

2. The cooling system of claim 1, wherein the IT container is one of a plurality of IT containers in a cluster, wherein the secondary condenser is coupled to each of the IT containers via a respective vapor line to receive at least a portion of vapor from a corresponding IT container.

3. The cooling system of claim 1, wherein the primary condenser is configured to condense the vapor to cooling liquid that is returned back to the liquid region of the IT container.

4. The cooling system of claim 1, wherein the IT container comprises:
   a vapor port coupled between vapor region and the vapor line; and
   a liquid inlet coupled between the liquid region and the coolant distribution unit to receive the cooling liquid from the coolant distribution unit.

5. The cooling system of claim 1, further comprising a cooler system coupled to the secondary condenser via a cooling line to provide liquid cooling to the secondary condenser.

6. The cooling system of claim 5, wherein the secondary condenser comprises an air-to-liquid heat exchanger.

7. The cooling system of claim 5, wherein the vapor container comprises a pressure sensor to measure a vapor pressure of the vapor within the vapor container, wherein the cooler system is activated to deliver cooling fluid to the secondary condenser in response to determining that the vapor pressure is above a predetermined pressure threshold.

8. The cooling system of claim 7, wherein the cooling line comprises a valve that is controlled based on the vapor pressure to activate or deactivate a cooling fluid connection between the secondary condenser and the cooler system.

9. The cooling system of claim 5, wherein the cooler system comprises an air-to-liquid heat exchanger.

10. The cooling system of claim 9, further comprising one or more fans to circulate cooling air within the cooler system based on a vapor pressure near the secondary condenser.

11. The cooling system of claim 1, further comprising a cooling air channel coupled to the secondary condenser to provide air cooling to the secondary condenser.

12. The cooling system of claim 11, wherein the secondary condenser comprises an air-to-air heat exchanger.

13. The cooling system of claim 11, wherein the vapor container comprises a pressure sensor to measure a vapor pressure of the vapor within the vapor container, wherein the air cooling is provided to the secondary condenser via the cooling air channel in response to determining that the vapor pressure is above a predetermined pressure threshold.

14. The cooling system of claim 13, further comprising an air control panel disposed between the cooling air channel and the vapor container, wherein the air control panel is controlled based on the vapor pressure to activate or deactivate an air connection between the secondary condenser and the cooling air channel to allow the secondary condenser to receive cooling air.

15. The cooling system of claim 13, further comprising one or more fans to circulate cooling air within the cooling air channel based on the vapor pressure within the secondary condenser.

16. A data center system, comprising:
   a plurality of clusters of information technology (IT) containers, each IT container including a liquid region to store cooling liquid, a vapor region to receive vapor evaporated from the cooling liquid, and a primary condenser disposed within the vapor region to condense the vapor;
   a secondary condensing system, comprising:
      a vapor container coupled to each of the IT containers via a vapor line to receive and contain least a portion of the vapor from the vapor region of the IT container, and
      a plurality of secondary condensers disposed within the vapor container, each of the secondary condensers corresponding to one of the clusters of IT containers, wherein each of the secondary condensers is configured to condense the vapor within a local region of the vapor container in which the secondary condenser is located, using air cooling or liquid cooling received from an external cooling source, wherein an amount of air cooling or liquid cooling is controlled based on an amount of vapor contained within the local region; and
   a coolant distribution unit coupled to the IT containers of the clusters and the secondary condensers to store and to distribute the cooling liquid to the IT containers of the clusters, wherein the coolant distribution unit is configured to receive cooling liquid condensed by each of the secondary condenser via a liquid line respectively.

17. The data center system of claim 16, wherein the vapor container comprises:
   a first region corresponding to a first cluster of IT containers, the first region containing a first secondary condenser and a first pressure sensor; and
   a second region corresponding to a second cluster of IT containers, the second region containing a second secondary condenser and a second pressure sensor.

18. The data center system of claim 17, wherein a first amount of air cooling or liquid cooling provided to the first secondary condenser is determined based on a first vapor pressure within the first region measured by the first pressure sensor, and wherein a second amount of air cooling or liquid cooling provided to the second secondary condenser is determined based on a second vapor pressure within the second region measured by the second pressure sensor.

19. The data center system of claim 17, further comprising a cooler system coupled to the first and second secondary condensers via a respective cooling line to provide liquid cooling to the first and second secondary condensers.

20. The data center system of claim 17, further comprising:
- a cooling air channel coupled to the first and second secondary condensers to provide air cooling to the first and second secondary condensers;
- a first air control panel disposed between the cooling air channel and the first region of the vapor container, wherein the first air control panel is controlled based on a first vapor pressure measured by the first pressure sensor; and
- a second air control panel disposed between the cooling air channel and the second region of the vapor region, wherein the second air control panel is controlled based on a second vapor pressure measured by the second pressure sensor.

* * * * *